United States Patent
Park

(10) Patent No.: US 8,372,751 B2
(45) Date of Patent: Feb. 12, 2013

(54) METHOD FOR FABRICATING SIDE CONTACT IN SEMICONDUCTOR DEVICE

(75) Inventor: Sung-Eun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/237,281

(22) Filed: Sep. 20, 2011

(65) Prior Publication Data

US 2012/0149205 A1 Jun. 14, 2012

(30) Foreign Application Priority Data

Dec. 8, 2010 (KR) .................. 10-2010-0124968

(51) Int. Cl.
*H01L 21/311* (2006.01)

(52) U.S. Cl. ........ 438/702; 430/156; 430/262; 430/268; 430/424; 430/427; 430/435; 430/666; 430/674; 430/696; 430/700; 430/703; 430/704; 430/735; 430/736; 430/761

(58) Field of Classification Search .................. 438/156, 438/262, 268, 424, 427, 435, 666, 674, 696, 438/700, 702–704, 735–736, 761
See application file for complete search history.

(56) References Cited

U.S. PATENT DOCUMENTS

| 2004/0029346 A1* | 2/2004 | Jaiprakash et al. ........... 438/268 |
| 2012/0007258 A1* | 1/2012 | Oh et al. ....................... 257/776 |
| 2012/0009787 A1* | 1/2012 | Kim .............................. 438/674 |

* cited by examiner

*Primary Examiner* — Bac Au
(74) *Attorney, Agent, or Firm* — IP & T Group LLP

(57) ABSTRACT

A method for fabricating a semiconductor device includes etching a substrate to form a body separated by a trench, forming liner layers that cover sidewalls of the body, forming a sacrificial layer that fills the trench and exposes an upper sidewall of each liner layer, forming a hard mask pattern that covers a first one of the liner layers having the exposed upper sidewalls, forming a barrier layer to be selectively grown over the exposed upper sidewalls of a second one of the liner layers, removing the hard mask pattern, removing a part of the sacrificial layer to expose a lower sidewall of a first one of the liner layers, and removing the lower sidewall of the first one of the liner layers to form a side contact.

18 Claims, 6 Drawing Sheets

METHOD FOR FABRICATING SIDE CONTACT IN SEMICONDUCTOR DEVICE

CROSS-REFERENCE TO RELATED APPLICATIONS

The present application claims priority of Korean Patent Application No. 10-2010-0124968, filed on Dec. 8, 2010, which is incorporated herein by reference in its entirety.

BACKGROUND

1. Field

Exemplary embodiments of the present invention relate to a method for fabricating a semiconductor device, and more particularly, to a method for forming a side contact in a semiconductor device.

2. Description of the Related Art

When a buried bitline (BBL) is used in a semiconductor device having a cell of a vertical transistor, two cells may be adjacent to one buried bitline. In order to drive one cell by one buried bitline, a one-side-contact (OSC) process for insulating one active region while forming a contact in another active region may be performed. Hereinafter, the 'OSC process' will be briefly referred to as a side contact process. In a cell of a vertical transistor using the side contact process, an active region includes a body separated/isolated by a trench and a pillar formed on the body. The buried bitline fills the trench between bodies and a word line (or a vertical gate) extends in the direction crossing the buried bitline and being adjacent to the sidewall of the pillar. A vertical direction channel is formed by the word line.

A part of one sidewall of the body (an active region) is exposed through the side contact process to form a connection between the active region and the buried bitline. Furthermore, a dopant is implanted or diffused into the exposed part of the sidewall of the body to form a junction for the active region and the buried bitline, and the buried bitline and the body are electrically connected to each other through the junction.

However, since the active region has a high aspect ratio, the degree of process difficulty for forming a side contact is high and it is difficult to ensure the side contact of uniform position and height.

SUMMARY

An embodiment of the present invention is directed to a method for fabricating a semiconductor device, which is capable of forming a side contact of uniform position and height in order for a connection between a buried bitline and a junction.

In accordance with an embodiment of the present invention, a method for fabricating a semiconductor device includes: etching a substrate to form a body separated by a trench; forming liner layers that cover respective sidewalls of the body; forming a sacrificial layer that fills the trench and exposes an upper sidewall of each liner layers; forming a hard mask pattern that covers a first one of the liner layers having the exposed upper sidewalls; forming a barrier layer to be selectively grown over the exposed upper sidewall of a second one of the liner layers; removing the hard mask pattern; removing a part of the sacrificial layer to expose a lower sidewall of the first one of the liner layers; and removing the lower sidewall of the first one of the liner layers to form a side contact.

In accordance with another embodiment of the present invention, a method for fabricating a semiconductor device includes: etching a substrate using a first hard mask pattern as an etch barrier to form a body separated by a trench; forming first liner layers that cover respective sidewalls of the body; forming second liner layers that each cover a sidewall of a respective one of the first liner layers while exposing a lower portion of the respective sidewall; forming a sacrificial layer that exposes an upper sidewall of a respective one of the second liner layers and covers the exposed lower portion of a sidewall of a respective one of the first liner layers; forming a second hard mask pattern that covers a first one of the second liner layers having the exposed upper sidewalls; forming a barrier layer to be selectively grown over the exposed upper sidewall of a second one of the second liner layers; removing the second hard mask pattern; removing a part of the sacrificial layer to expose the lower portion of the sidewall of a first one of the first liner layers; and removing the lower portion of the sidewall of the first one of the first liner layers to form a side contact.

DETAILED DESCRIPTION

Figure 1A:
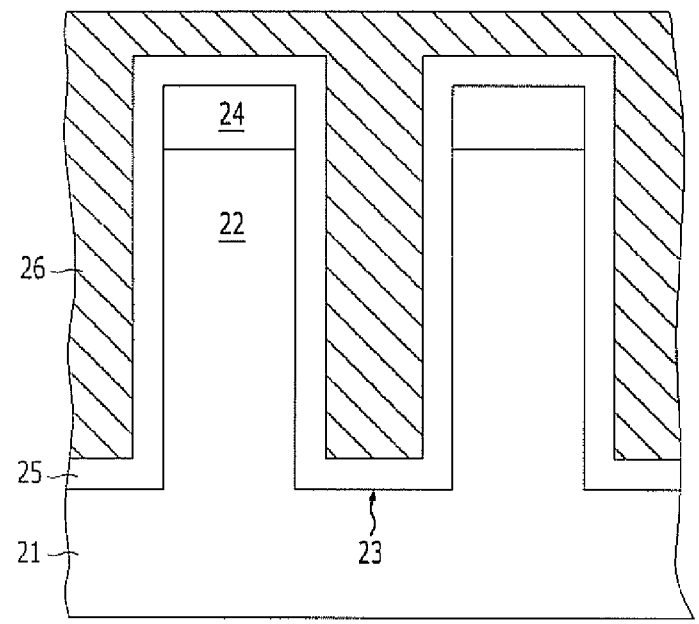
FIGS. 1A to 1K are cross-sectional views illustrating a method for fabricating a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1K are cross-sectional views illustrating a method for fabricating a semiconductor device in accordance with an embodiment of the present invention.

Referring to FIG. 1A, a substrate 21 is etched using a first hard mask pattern 24 as an etch barrier to form a body 22. The substrate 21 includes a silicon substrate and thus the body 22 includes a silicon body. A plurality of bodies may be formed and separated by a trench 23.

A first liner layer 25 is formed on a resultant structure including the body 22 as an insulation layer. The first liner layer 25 includes an oxide layer such as a silicon oxide layer. The body 22 has a line-type pillar structure. A structure of the body 22 and the first hard mask pattern 24 will be briefly referred to as a pillar structure, and a plurality of pillar structures may be separated from each other by the trench 23.

A first sacrificial layer 26 is formed on the first liner layer 25 to gap-fill the trench 23. The first sacrificial layer 26 includes undoped polysilicon or amorphous silicon.

Figure 1B:
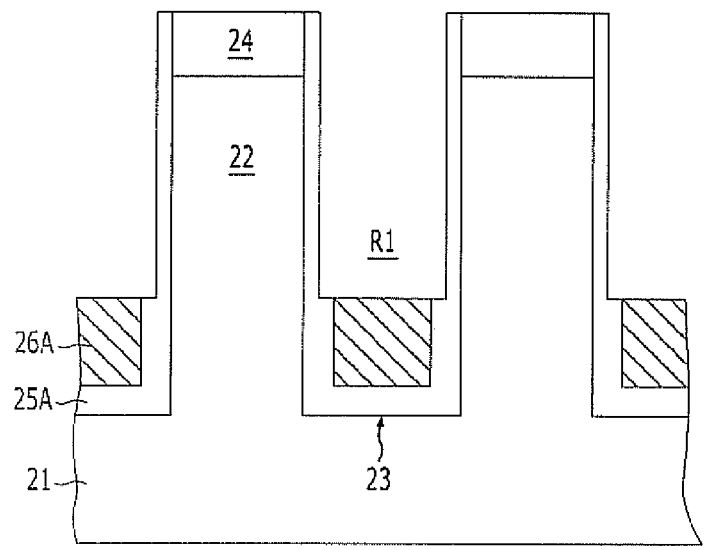

Referring to FIG. 1B, the first sacrificial layer 26 is planarized until the surface of the first hard mask pattern 24 is exposed. The planarization of the first sacrificial layer 26 may be performed by a chemical mechanical polishing (CMP) process. Subsequently, an etch-back process is performed. After the etch-back process is performed, a first sacrificial pattern 26A remains to partially gap-fill between the bodies 22, thereby providing a first recess R1. In the CMP process, the first liner layer 25 on the first hard mask pattern 24 may be polished. Thus, a first liner pattern 25A remains to cover both sidewalls of the first hard mask pattern 24 and the trench 23. The first liner pattern 25A also covers the bottom of the trench 23.

The first liner pattern 25A is subject to slimming using a wet etch process. At this time, a wet etch time is adjusted, so that the first liner pattern 25A with a predetermined thickness remains on the sidewall of the body 22.

Figure 1C:
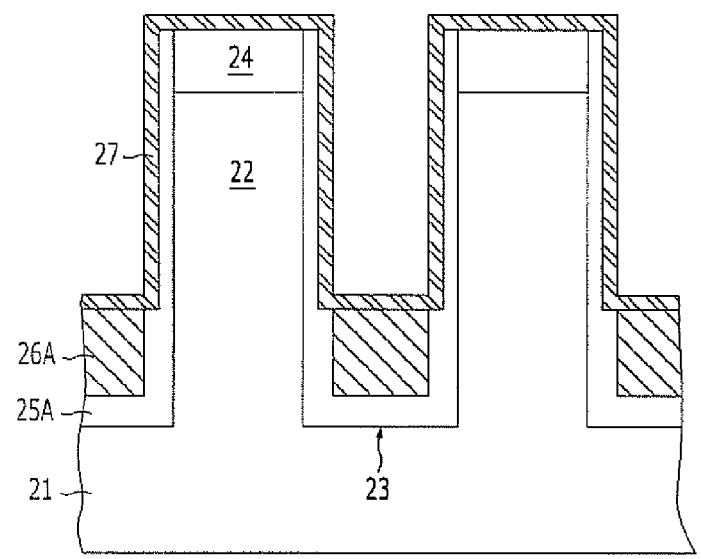

Referring to FIG. 1C, a second liner layer 27 is formed on a resultant structure including the first sacrificial pattern 26A. The second liner layer 27 includes a polysilicon layer. The second liner layer 27 has a thickness substantially the same as the slimmed thickness of the first liner pattern 25A. The second liner layer 27 may include an amorphous silicon or epitaxial silicon layer in addition to a polysilicon layer.

Figure 1D:
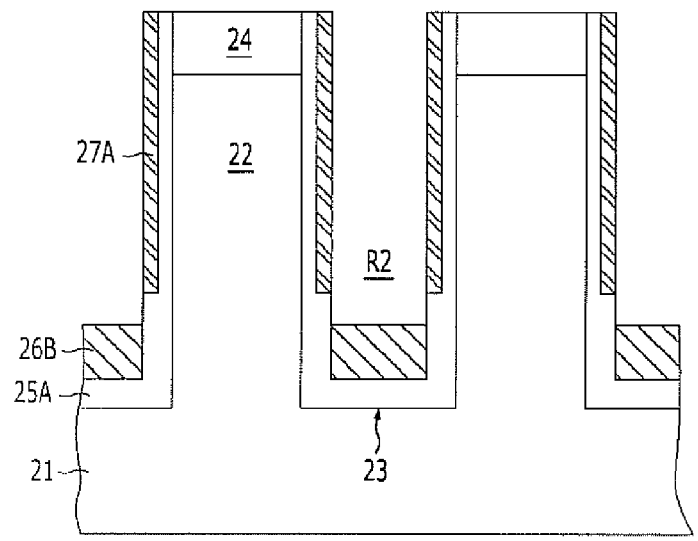

Referring to FIG. 1D, the second liner layer 27 is selectively etched. Thus, a second liner pattern 27A is formed on a slimmed region of the first liner pattern 25A. In order to form the second liner pattern 27A, an etch-back process may be used, and thus the second liner pattern 27A is provided in the form of a spacer.

The first sacrificial pattern 26A is recessed by a predetermined depth using the second liner pattern 27A as an etch barrier. Thus, a second recess R2 is formed to expose the lower sidewall of the first liner pattern 25A. The first sacrificial pattern 26A recessed for forming the second recess R2 is indicated by reference numeral '26B'. When the first sacrificial pattern 26B includes polysilicon, it is recessed using an etch-back process.

Figure 1E:
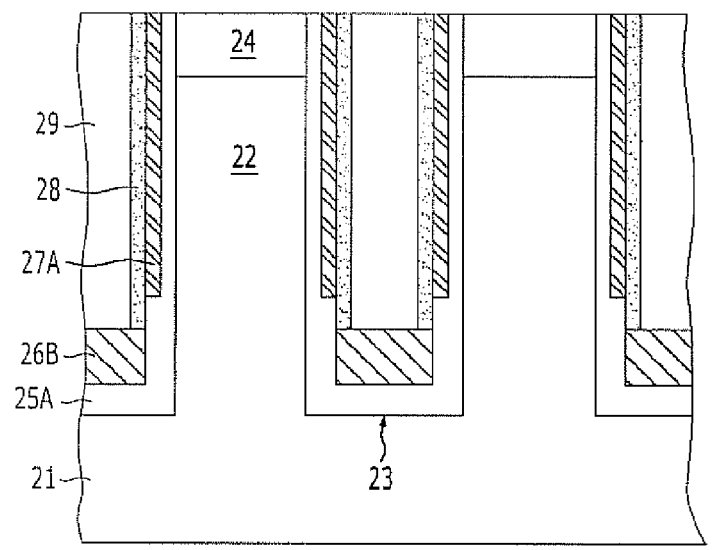

Referring to FIG. 1E, a metal nitride layer is conformally formed on a resultant structure including the second recess R2. A spacer etch process is performed to form a second sacrificial pattern 28 in the form of a spacer. The second sacrificial pattern 28 covers the second liner pattern 27A at both sidewalls of the body 22. The second sacrificial pattern 28 includes a titanium nitride (TiN) layer. The second sacrificial pattern 28 does not only cover the sidewall of the second liner pattern 27A but also covers the lower sidewall of the first liner pattern 25A.

A third sacrificial layer 29 is formed to gap-fill the second recess R2 in which the second sacrificial pattern 28 has been formed. The third sacrificial layer 29 includes an oxide layer. The third sacrificial layer 29 includes a spin-on dielectric (SOD) layer. The third sacrificial layer 29 is planarized until the surface of the first hard mask pattern 24 is exposed. The planarization of the third sacrificial layer 29 is performed by the CMP process.

Figure 1F:
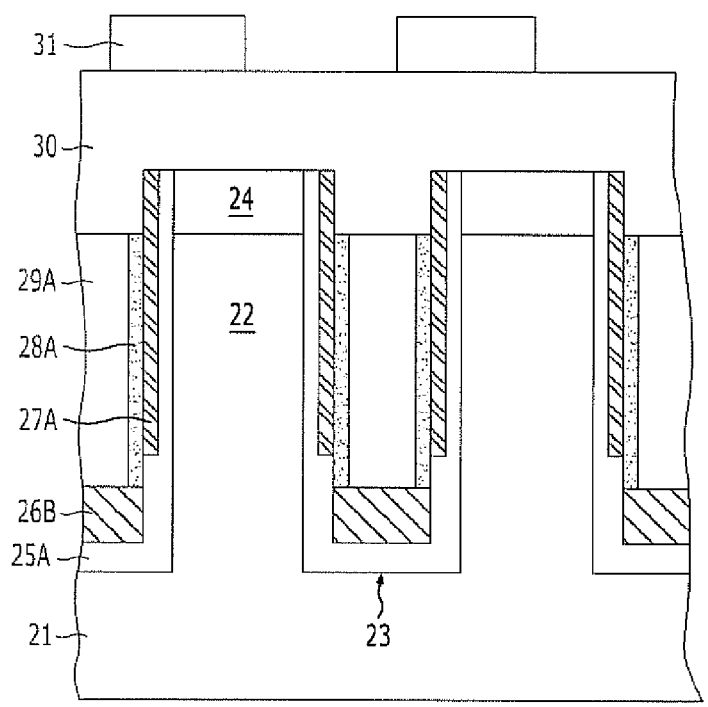

Referring to FIG. 1F, an etch-back process is performed to recess the third sacrificial layer 29 and the second sacrificial pattern 28. They are recessed by the thickness of the first hard mask pattern 24. After the upper portions of the third sacrificial layer 29 and the second sacrificial pattern 28 are recessed by predetermined depths, they remain as indicated by reference numerals '29A' and '28A'. Hereinafter, the recessed third sacrificial layer will be referred to as a third sacrificial pattern 29A.

A second hard mask layer 30 is formed on a resultant structure including the third sacrificial pattern 29A. The second hard mask layer 30 includes a spin-on carbon (SOC) layer. The SOC layer is a carbon layer formed using a spin-on coating method. The carbon layer is formed using the spin-on coating method, thereby gap-filling the recessed area on the third sacrificial pattern 29A.

A photoresist pattern 31 is formed on the second hard mask layer 30. The photoresist pattern 31 will be referred to as a side contact mask, that is, an OSC mask. The photoresist pattern 31 exposes a part where a side contact is to be formed. One side of the photoresist pattern 31 may be aligned to cover the half of the upper surface of the first hard mask pattern 24 and the other side thereof may be aligned to cover a part of the surface of the third sacrificial pattern 29A.

Figure 1G:
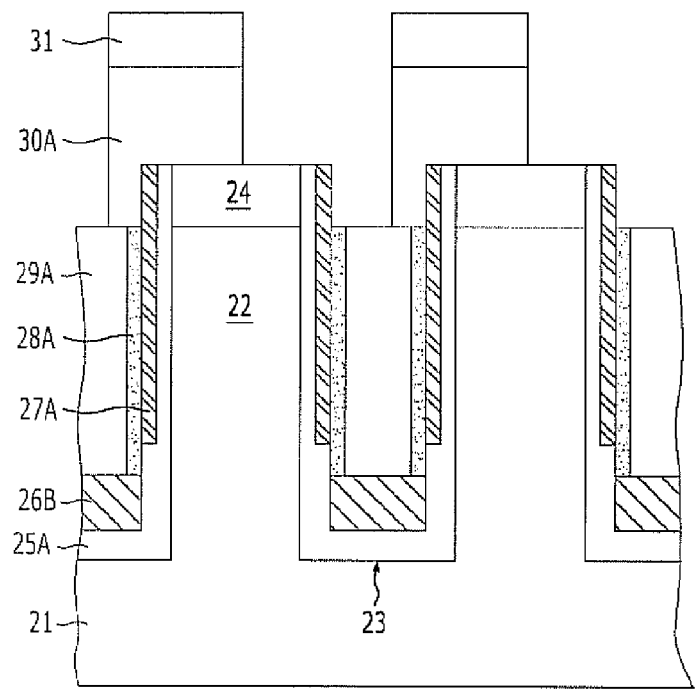

Referring to FIG. 1G, the second hard mask layer 30 is etched using the photoresist pattern 31 as an etch barrier. Thus, a second hard mask pattern 30A is formed, so that at least one upper portion of the second liner pattern 27A, at least one surface of the second sacrificial pattern 28A, and a surface of the third sacrificial pattern 29A, which are not covered by the second hard mask pattern 30A, are exposed. Specifically, the upper sidewall of the second liner pattern 27A is exposed.

Figure 1H:
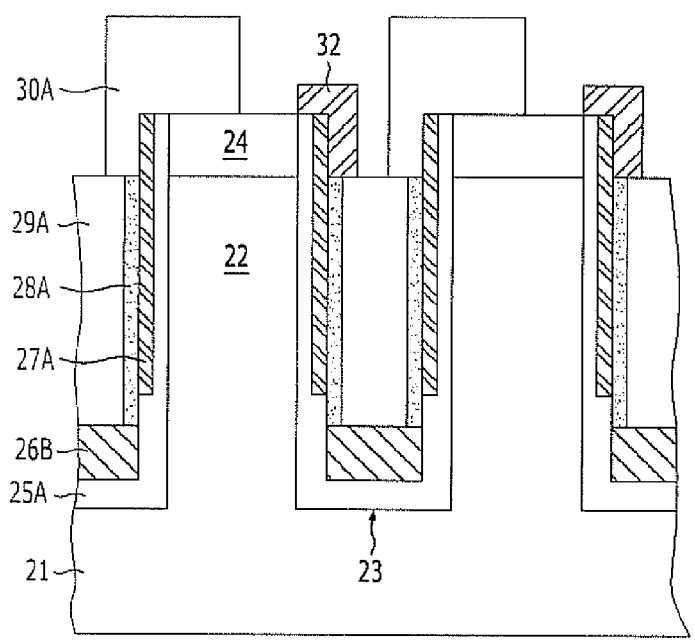

Referring to FIG. 1H, the photoresist pattern 31 is removed.

A selective deposition process is performed in the state that the upper sidewall of the second liner pattern 27A is exposed. In the selective deposition process, deposits may be selectively formed over the exposed upper sidewall of the second liner pattern 27A.

Since the second liner pattern 27A includes polysilicon, a silicon layer is formed on the exposed upper sidewall of the second liner pattern 27A through the selective deposition process. The silicon layer is a barrier layer 32. The barrier layer 32 serves as an etch barrier when forming a subsequent side contact. As a result, the barrier layer 32 covers the surface of the second sacrificial pattern 28A, and a part of the surface of the third sacrificial pattern 29A is exposed by the barrier layer 32 and the second hard mask pattern 30A.

The barrier layer 32 may be formed using a selective epitaxial growth (SEG) process.

The barrier layer 32 includes one selected from the group consisting of polysilicon, epitaxial silicon and amorphous silicon. The barrier layer 32 may be formed with a thickness of 100 Å. The barrier layer 32 may be doped or undoped. When the barrier layer 32 is doped, arsenic (As) or phosphorus (P) is doped.

When the barrier layer 32 includes a silicon layer, a selective deposition process of the barrier layer 32 may be performed at the temperature of 400° C. to 900° C. under the pressure of 10 mTorr to 760 Torr. A wet or dry pre-cleaning process and an in-situ H2-bake process immediately before silicon growth are not performed. This is because the spin-on carbon (the second hard mask pattern 30A) and the third sacrificial pattern 29A may be partially lost. For reference, the in-situ H2-bake process is performed at the temperature of 750° C. to 850° C. under the hydrogen atmosphere to remove a native oxide layer.

Figure 1I:
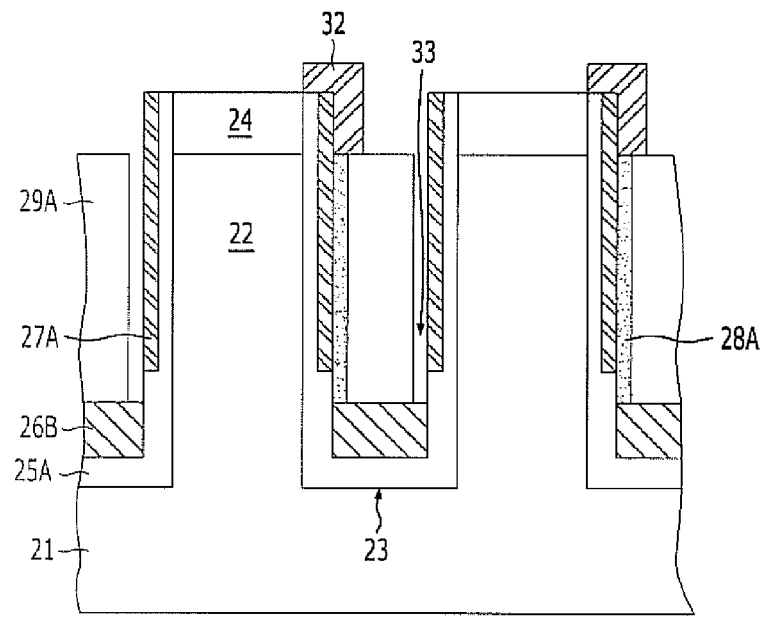

Referring to FIG. 1I, the second hard mask pattern 30A is removed, and then the second sacrificial pattern 28A, which has been covered by the second hard mask pattern 30A, is removed. In order to remove the second sacrificial pattern 28A, SPM (sulfuric peroxide mixture, $H_2SO_4/H_2O_2$)-based chemical is used. In the SPM, the mixture ratio of $H_2SO_4$ and $H_2O_2$ is 4:1 to 20:1, and the chemical temperature is set to a high temperature of 100° C. to 200° C. The SPM-based chemical is used as described above, so that the second sacrificial pattern 28A can be selectively removed, another second sacrificial pattern 28A covered by the barrier layer 32 is not removed.

In this way, the second sacrificial pattern 28A is removed, so that a part (a lower sidewall) of the first liner pattern 25A formed on one sidewall of the body 22, where a side contact is to be formed, may be selectively exposed (see 33).

Figure 1J:
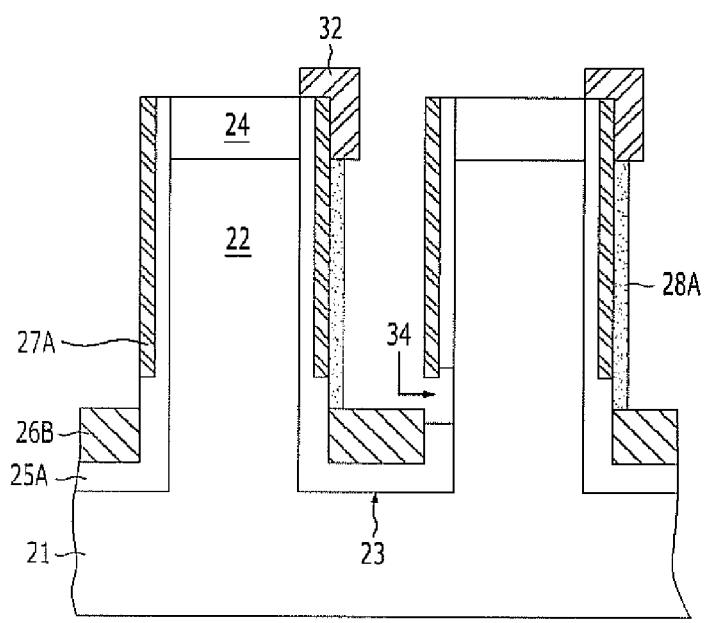

Referring to FIG. 1J, the third sacrificial pattern 29A is removed. At this time, the lower sidewall of the first liner pattern 25A is simultaneously removed to form a side contact area 34. Since the third sacrificial pattern 29A and the first liner pattern 25A include an oxide layer, buffered oxide etch (BOE) chemical is used.

The side contact area 34 exposes a part of one sidewall of the body 22.

When removing the third sacrificial pattern 29A, the barrier layer 32, the remaining second sacrificial pattern 28A, and the second liner pattern 27A serve as an etch barrier.

Figure 1K:
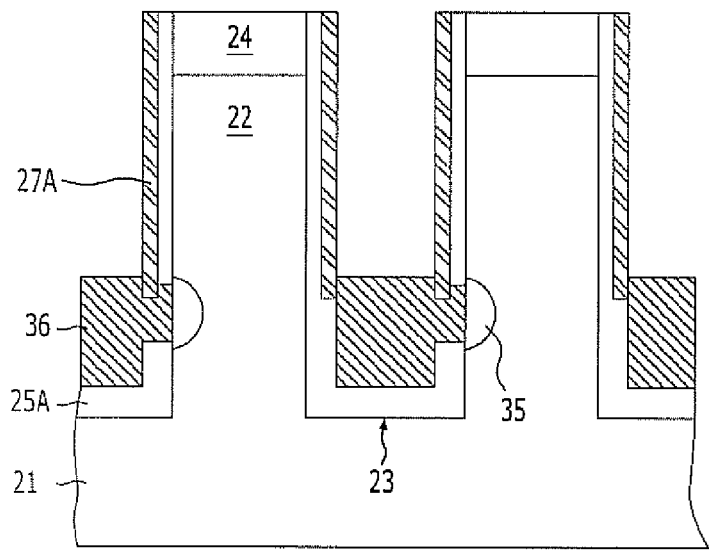

Referring to FIG. 1K, a junction region 35 is formed on one sidewall of the body 22 exposed by the side contact area 34. The junction region 35 may be formed using an ion implantation method or a plasma doping method. Also, the junction region 35 may be formed by gap-filling a doped layer such as doped polysilicon and performing a heat treatment. Dopant of the doped layer may include an N type impurity such as phosphorus (P). Thus, the junction region 35 is an N type junction.

The first sacrificial pattern 26B is removed. Simultaneously, the barrier layer 32 is also removed.

The second sacrificial pattern 28A is removed. In order to remove the second sacrificial pattern 28A, the SPM-based chemical is used. In the SPM, the mixture ratio of $H_2SO_4$ and $H_2O_2$ is 4:1 to 20:1, and the chemical temperature is set to a high temperature of 100° C. to 200° C. The SPM-based chemical is used as described above, so that the second sacrificial pattern 28A can be selectively removed.

A buried bitline 36 connected to the junction region 35 is formed to partially fill the trench 23. The buried bitline 36 includes a titanium (Ti) layer, a titanium nitride (TiN) layer, and a tungsten (W) layer. For example, the buried bitline 36 is formed by thinly forming JO the titanium layer and the titanium nitride layer and gap-filling the tungsten layer. A planarization process and an etch-back process are performed, so that the trench 23 is partially filled. The titanium layer and the titanium nitride layer are barrier metals. As the occasion demands, a barrier metal may be formed and then silicide may be formed on the surface of the junction region 35. The silicide serves as an ohmic contact between the junction region 35 and the buried bitline 36 to reduce contact resistance.

As described above, since the buried bitline 36 is formed using the metal layer, resistance thereof is low. Furthermore, since only one buried bitline 36 is connected to one junction region 35, high integration may be facilitated.

Figure 2:
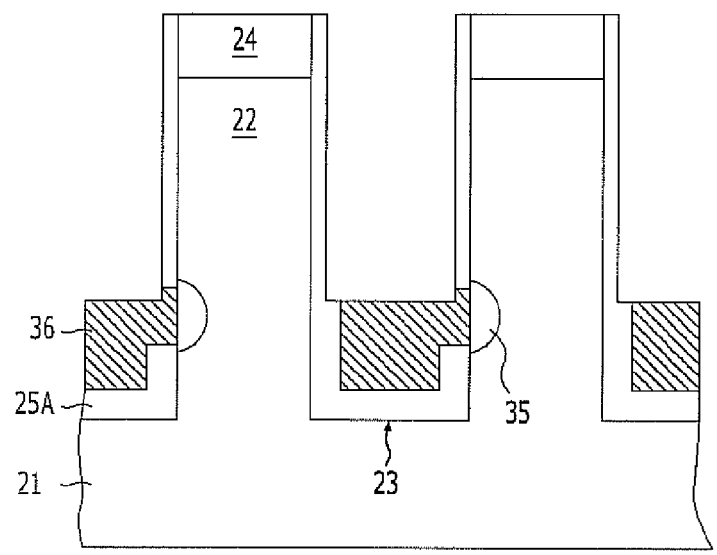
FIG. 2 is a diagram illustrating a semiconductor device according to another embodiment of the present invention.

FIG. 2 is a diagram illustrating a semiconductor device according to another embodiment of the present invention. The second liner pattern 27A is removed, and then the buried bitline 36 is formed. That is, the second liner pattern 27A may be removed before the buried bitline 36 is formed.

In accordance with the embodiment of the present invention, a barrier layer is formed on a liner layer using a selective deposition process and a side contact is formed using the same, so that the side contact of uniform height and position may be formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   etching a substrate to form a body separated by a trench;
   forming liner layers that cover respective sidewalls of the body;
   forming a sacrificial layer that fills the trench and exposes an upper sidewall of each liner layer;
   forming a hard mask pattern that covers a first one of the liner layers having the exposed upper sidewalls;
   forming a barrier layer to be selectively grown over the exposed upper sidewall of a second one of the liner layers;
   removing the hard mask pattern;
   removing a part of the sacrificial layer to expose a lower sidewall of the first one of the liner layer; and
   removing the lower sidewall of the first one of the liner layers to form a side contact.

2. The method of claim 1, wherein, the barrier layer is formed by a selective epitaxial growth process.

3. The method of claim 1, wherein the liner layer and the barrier layer include a silicon layer.

4. The method of claim 1, wherein the barrier layer includes an undoped silicon layer or a doped silicon layer.

5. The method of claim 1, wherein the liner layer has a dual structure of an oxide layer and a silicon layer, the lower sidewall of the liner layer is formed by the oxide layer, and the upper sidewall of the liner layer is formed by the silicon layer.

6. The method of claim 1, wherein the sacrificial layer includes a titanium nitride layer and an oxide layer, and the titanium nitride layer is removed in the removing of the part of the sacrificial layer.

7. The method of claim 1, wherein the hard mask pattern includes a carbon layer formed by a spin-on coating method.

8. The method of claim 1, wherein the forming of the hard mask pattern comprises:
   forming a carbon layer over a resultant structure including the liner layers having the exposed upper sidewall using a spin-on coating method;
   forming a photoresist pattern over the carbon layer; and
   etching the carbon layer using the photoresist pattern as an etch barrier.

9. The method of claim 8, wherein the photoresist pattern is formed on a part of the carbon layer that covers a half of an upper surface of the body and a part of a surface of the sacrificial layer.

10. A method for fabricating a semiconductor device, comprising:
    etching a substrate using a first hard mask pattern as an etch barrier to form a body separated by a trench;
    forming first liner layers that cover respective sidewalls of the body;
    forming second liner layers that each cover a sidewall of a respective one of the first liner layers while exposing a lower portion of the respective sidewall;
    forming a sacrificial layer that exposes an upper sidewall of a respective one of the second liner layers and covers the exposed lower portion of a sidewall of a respective one of the first liner layers;
    forming a second hard mask pattern that covers a first one of the second liner layers having the exposed upper sidewalls;
    forming a barrier layer to be selectively grown over the exposed upper sidewall of a second one of the second liner layers;

removing the second hard mask pattern;
removing a part of the sacrificial layer to expose the lower portion of a sidewall of a first one of the first liner layers; and
removing the lower portion of the sidewall of the first one of the first liner layer to form a side contact.

11. The method of claim 10, wherein the first liner layer includes an oxide layer and the second liner layer includes a silicon layer.

12. The method of claim 10, wherein, the barrier layer is formed by a selective epitaxial growth process.

13. The method of claim 10, wherein the second liner layer and the barrier layer include a silicon layer.

14. The method of claim 10, wherein the barrier layer includes an undoped silicon layer or a doped silicon layer.

15. The method of claim 10, wherein the sacrificial layer includes a titanium nitride layer and an oxide layer, and the titanium nitride layer is removed in the removing of the part of the sacrificial layer.

16. The method of claim 10, wherein the second hard mask pattern includes a carbon layer formed by a spin-on coating method.

17. The method of claim 10, wherein the forming of the second hard mask pattern comprises:
forming a carbon layer over a resultant structure including the second liner layers having the exposed upper sidewall using a spin-on coating method;
forming a photoresist pattern over the carbon layer; and
etching the carbon layer using the photoresist pattern as an etch barrier.

18. The method of claim 17, wherein, the photoresist pattern is formed on a part of the carbon layer that covers a half of an upper surface of the body and a part of a surface of the sacrificial layer.

* * * * *